US008009520B2

(12) United States Patent
Jau et al.

(10) Patent No.: US 8,009,520 B2
(45) Date of Patent: Aug. 30, 2011

(54) METHOD AND SYSTEM FOR OPERATING AN ATOMIC CLOCK USING A SELF-MODULATED LASER WITH ELECTRICAL MODULATION

(75) Inventors: Yuan-Yu Jau, Princeton, NJ (US); Kiyoshi Ishikawa, Hyogo (JP); William Happer, Princeton, NJ (US)

(73) Assignee: Princeton University, Princeton, NJ (US)

( * ) Notice: Subject to any disclaimer, the term of this patent is extended or adjusted under 35 U.S.C. 154(b) by 592 days.

(21) Appl. No.: 12/116,431

(22) Filed: May 7, 2008

(65) Prior Publication Data

US 2009/0080479 A1 Mar. 26, 2009

Related U.S. Application Data

(60) Provisional application No. 60/994,631, filed on Sep. 20, 2007.

(51) Int. Cl.

| | |
|---|---|
| ***G04B 47/00*** | (2006.01) |
| *G04F 5/00* | (2006.01) |
| *G01V 3/00* | (2006.01) |
| *H03L 7/26* | (2006.01) |

(52) U.S. Cl. ............ 368/156; 324/301; 324/304; 331/3; 331/94.1

(58) Field of Classification Search .................. 368/327; 324/300–301, 304; 331/1 R, 3, 5, 94

See application file for complete search history.

(56) References Cited

U.S. PATENT DOCUMENTS

| | | | | |
|---|---|---|---|---|
| 5,602,475 | A * | 2/1997 | Bohler | 324/301 |
| 5,606,291 | A * | 2/1997 | Verbanets | 331/3 |
| 5,656,974 | A * | 8/1997 | Thomann et al. | 331/3 |
| 5,657,340 | A * | 8/1997 | Camparo et al. | 372/69 |
| 5,712,597 | A * | 1/1998 | Atsumi et al. | 331/94.1 |
| 6,303,928 | B1 * | 10/2001 | Buell et al. | 250/251 |
| 6,888,780 | B2 * | 5/2005 | Happer et al. | 368/10 |
| 7,102,451 | B2 * | 9/2006 | Happer et al. | 331/94.1 |

* cited by examiner

*Primary Examiner* — Sean Kayes

(74) *Attorney, Agent, or Firm* — Porzio, Bromberg & Newman, P.C.

(57) ABSTRACT

A polarization gain medium such as an emitting laser diode provides the optical pumping. An atomic vapor cell is positioned in the laser cavity providing spontaneous push-pull optical pumping inside the laser cavity. This causes the laser beam to be modulated at hyperfine-resonance frequency. A clock signal is obtained from electrical modulation across the laser diode.

17 Claims, 7 Drawing Sheets

METHOD AND SYSTEM FOR OPERATING AN ATOMIC CLOCK USING A SELF-MODULATED LASER WITH ELECTRICAL MODULATION

CROSS REFERENCE TO RELATED APPLICATION

This application is a claims priority to U.S. Provisional Application No. 60/994,631, filed on Sep. 20, 2007, the disclosure of this application is hereby incorporated by reference in its entirety.

STATEMENT OF GOVERNMENT FUNDED RESEARCH

This work was supported by the Air Force Office Scientific Research F49620-01-1-0297. Accordingly, the Government has certain rights in this invention.

BACKGROUND OF THE INVENTION

1. Field of the Invention

The present invention relates to the field of optically pumped atomic clocks, and more particularly to a method and system including a laser that is self-modulated by alkali-metal vapor at 0-0 atomic-clock frequency by using light of alternating polarization, referred to as push-pull optical pumping technique, and uses electrical modulation across the laser diode as a clock signal.

2. Description of the Related Art

Gas-cell atomic clocks and magnetometers use optically pumped alkali-metal vapors. Atomic clocks are applied in various systems that require extremely accurate frequency measurements. Atomic magnetometers are utilized in magnetic field detection with extremely high sensitivity. For example, atomic clocks are used in GPS (global positioning system) satellites and other navigation systems, as well as in high-speed digital communication systems, scientific experiments, and military applications. Magnetometers are used in medical systems, scientific experiments, industry and military applications.

A vapor cell used in atomic clocks or magnetometers contains a few droplets of alkali metal, such as potassium, rubidium, or cesium. A buffer gas, such as nitrogen, other noble gases, or a mixture thereof, is required to be filled inside the cell to match the spectral profile of the pumping light, suppress the radiation trapping, and diminish alkali-metal atoms diffusing to the cell wall. The gas cell is heated up to above room temperature to produce sufficient alkali-metal vapor. The resonances of alkali-metal ground-state hyperfine sublevels are especially useful for atomic clocks and atomic magnetometers. The hyperfine resonance is excited by rf (radio frequency) fields, microwave fields, or modulated light (CPT: coherent population trapping method). The resonance is probed by the laser beam. As shown in FIG. 1, hyperfine 0-0 resonance, $\nu_{00}$, is particularly interesting for atomic clocks because of its insensitivity of the magnetic field at low field regime; hyperfine end resonance, $\nu_{end}$, can be used either for atomic clocks and magnetometers; the Zeeman end resonance, $\nu_Z$, is usually used for a magnetometer because of its high sensitivity of the magnetic field. Besides the three illustrative resonances, other resonances of different hyperfine sublevels can also be used for atomic clocks and magnetometers. The resonance signal is reflected on the probing beam as a transmission dip or a transmission peak when the frequency is scanned through the resonance frequency. Conventionally, an atomic clock or a magnetometer measures the frequency at the maximum response of the atomic resonance. A local oscillator is required to generate the oscillation signal and excite the resonance. A precise clock ticking signal is therefore provided by the output of the local oscillator.

U.S. Pat. No. 7,323,941, hereby incorporated by reference in its entirety into this application, describes a self-modulated laser system 10, as shown in FIG. 2. No local oscillator is needed. Self-modulated laser system 10 uses polarization gain medium 12, such as an electronically pumped semiconductor, for example, quantum well heterojunction edge-emitting laser diode (ELD). Polarization gain medium 12 outputs light with linear polarization. In order to generate the alternation of photon spin, two quarter wave plates 13*a*, 13*b* are used inside laser cavity 11. Vapor cell 14 is positioned, where the laser beam has the maximum alternation of the light polarization, between quarter wave plates 13*a*, 13*b*. Bragg mirror 15 and output coupler 16 recombine beams so that they emerge as a single beam of alternating circular polarization. The transmission of light through external cavity 11 is measured with photodiode 18 to generate clock signal 19.

It is desirable to provide an improved method and system for reducing complexity, size and power consumption of an atomic clock.

SUMMARY OF THE INVENTION

The present invention provides a method and apparatus for operating an atomic clock in which the atomic-clock signal is directly obtained from a self-modulated laser system. The method and system is based on the physics of a push-pull optical pumping technique using an alkali-metal vapor cell placed inside a laser cavity to modulate the laser light at the frequency of the hyperfine resonance. In the laser cavity, a photonic gain medium, such as laser diodes or other kinds, can amplify the photon flux at different optical frequencies. Depending on the cavity configuration, optics may be needed to control the light polarization and the optical bandwidth.

Conventionally, a fast photodetector was used to convert the modulated light into an electrical signal modulated at the atomic clock frequency. It has been found that an electrical clock signal can be obtained directly from the laser diode the self-modulated light modulates the independence of the laser diode. The modulated voltage drop across the diode laser serves as an electrical output signal of the atomic clock. Eliminating the photodiode from the system provides reduction in size, power consumption, and lower manufacturing costs.

In one embodiment, a coupling circuit including a current source for the laser diode and an inductor placed after the current source is used. The inductor provides a larger voltage drop due to higher impedance at high clock frequency. In one embodiment, the clock signal from the laser diode is enhanced. A particular harmonic from the output voltage of the laser diode can be enhanced to provide a faster clock ticking signal.

The invention will be more fully described by reference to the following drawings.

DETAILED DESCRIPTION

Figure 1:
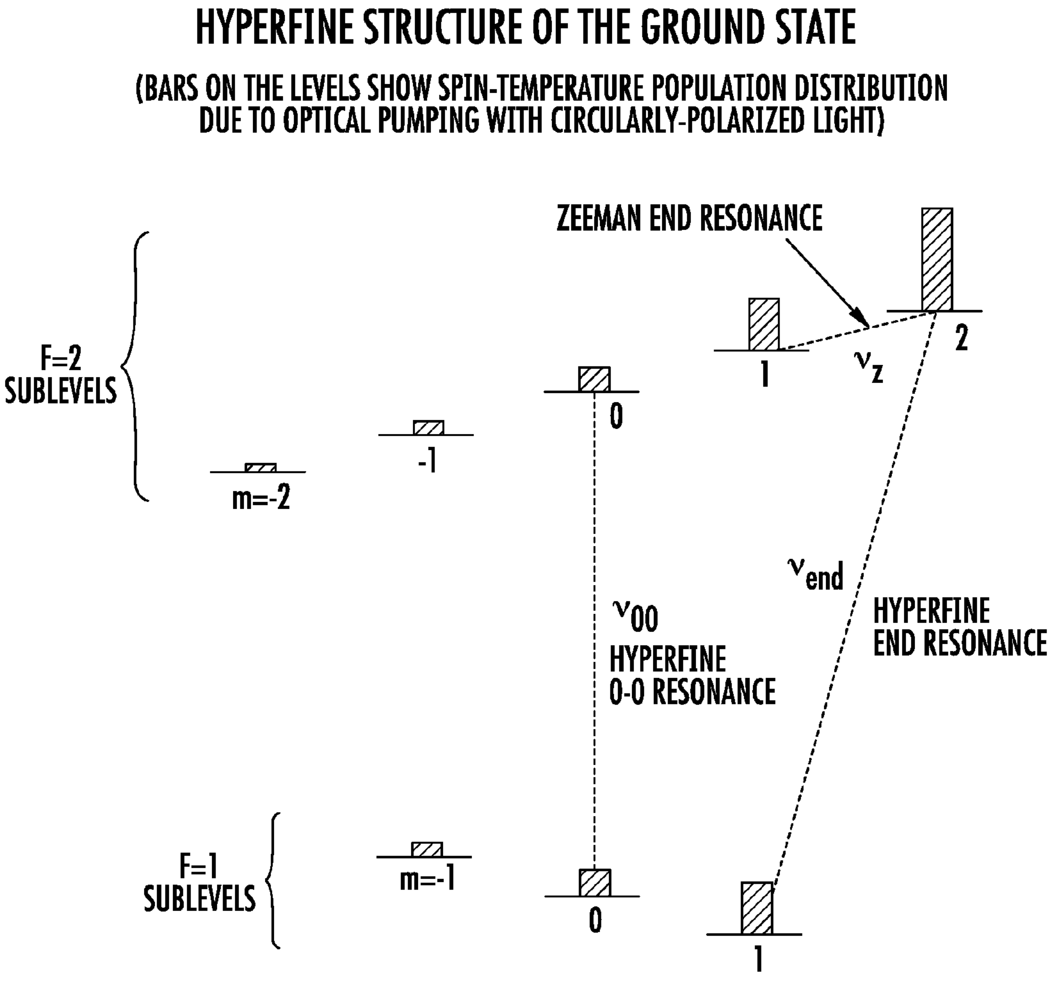
FIG. 1 is a schematic diagram of the ground-state hyperfine energy levels of a representative alkali-metal atom with nuclear spin I=3/2.
Figure 2:
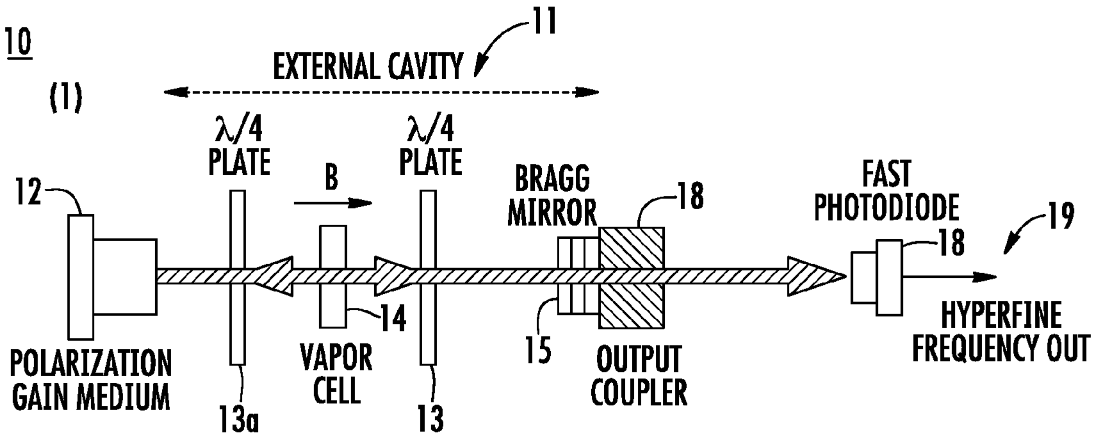
FIG. 2 (PRIOR ART)
FIG. 2 is a schematic diagram of a prior art cavity configuration for a laser modulated at hyperfine frequency.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
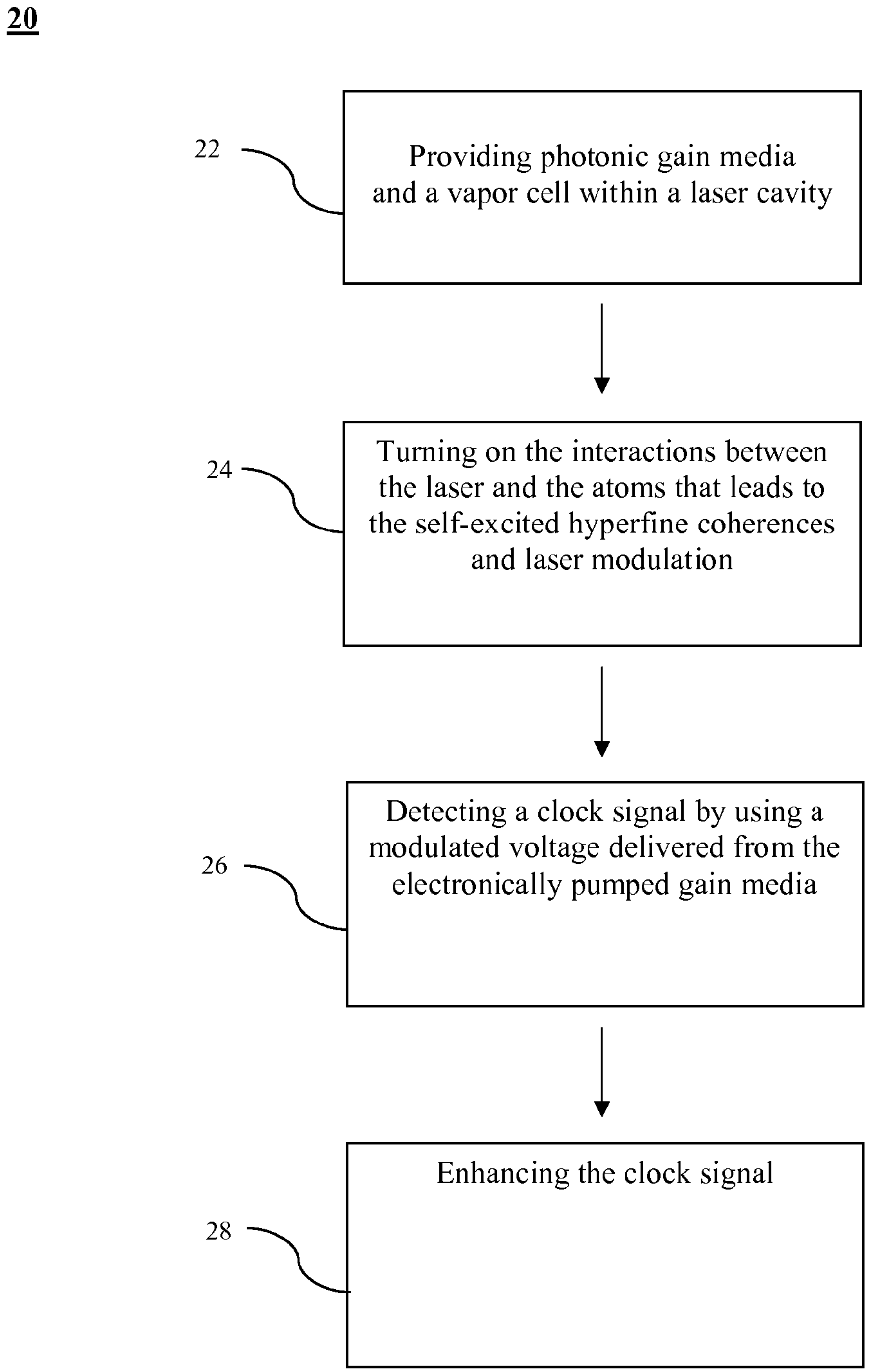
FIG. 3 is a flow diagram of a method for operating an atomic clock laser in accordance with the teachings of the present invention.

FIG. 3 is a flow diagram of a method of operating a self-modulated laser 20 in accordance with the teachings of the present invention. In block 22, one or more photonic gain media and a vapor cell are provided within a laser cavity. Example gain mediums include electronic pumped semiconductors, such as an edge-emitting laser diode or a vertical cavity surface emitting laser diode. Necessary optics can be provided for controlling light polarization and optic bandwidth. Optics can include wave plates, polarization filters, and optical filters. In block 24, hyperfine transitions of atoms within the vapor cell are excited by turning on the interactions between the laser and the atoms that leads to the self-excited hyperfine coherences and laser modulation at a hyperfine frequency.

The light of alternating polarization provides photons having spin that alternates its direction at a hyperfine frequency of the atoms at the location of the atoms. Light of alternating polarization is defined within the scope of this invention as an optical field, the electric field vector of which or some component thereof at the location of the atoms alternates at a hyperfine frequency of the atoms between rotating clockwise and rotating counter-clockwise in the plane perpendicular to the magnetic field direction. In one embodiment, the polarization of the light interacting with the atoms alternates from magnetic right circular polarization (mRCP) to magnetic left circular polarization (mLCP). mRCP light is defined as light for which the mean photon spin points along the direction of the magnetic field so that an absorbed photon increases the azimuthal angular momentum of the atom by 1 (in units of $\hbar$). mLCP is defined as light for which the mean photon spin points anti-parallel to the direction of the magnetic field so that an absorbed photon decreases the azimuthal angular momentum of the atom by 1 (in units of $\hbar$). For light beams propagating antiparallel to the magnetic field direction, mRCP and mLCP definitions are equivalent to the commonly used RCP and LCP definitions, respectively. However, for light beams propagating along the magnetic field direction, mRCP is equivalent to LCP, and mLCP is equivalent to RCP. In one embodiment, block 12 is performed by intensity or frequency modulating right circularly polarized (RCP) light at a repetition frequency equal to the frequency of the 0-0 resonance and combining it with similarly modulated left circularly polarized (LCP) light which is shifted or delayed relative to the RCP light by a half-integer multiple of the repetition period. Alternatively, the light of alternating polarization is generated by combining two beams of mutually perpendicular linear polarizations, wherein optical frequencies of the beams differ from each other by a hyperfine frequency of the atoms. Alternatively, the light of alternating polarization is generated by two counter-propagating beams that produce the electrical field vector at the location of the atoms which alternates at a hyperfine frequency of the atoms between rotating clockwise and rotating counter-clockwise in the plane perpendicular to the light propagation. Alternatively, the light of alternating polarization is generated by a system of spectral lines, equally spaced in frequency by a hyperfine frequency of the atoms wherein each spectral line is linearly polarized and the polarizations of adjacent lines are mutually orthogonal. Alternatively, the light of alternating polarization is generated by generating a sinusoidal intensity envelope of right circularly polarized light combined with a sinusoidal intensity envelope of left circularly polarized light that is shifted or delayed with respect to the right circularly polarized light by a half-integer multiple of a hyperfine period of the atoms. Push-pull pumping inside the vapor cell is spontaneously generated. An electric field of the pumping light inside the vapor cell is alternating its polarization at the hyperfine frequency.

In block 26, a clock signal is determined by using a modulated voltage delivered from the one or more electronically pumped gain media, such as a laser diode. In block 28, a particular clock signal is enhanced, the modulation of photon spins is self-executed and the atomic hyperfine coherence is generated. In one embodiment, a particular harmonic from the modulated voltage of the laser diode can be selected by using a resonant circuit coupled to the laser diode. The coupling efficiency of different harmonics can be tuned. The laser diode bias circuit in combination with a tuning circuit is used to pick up the desired harmonic as the clock signal. The pick-up harmonic can be independently amplified and serves as the fast ticking signal.

Figure 4:
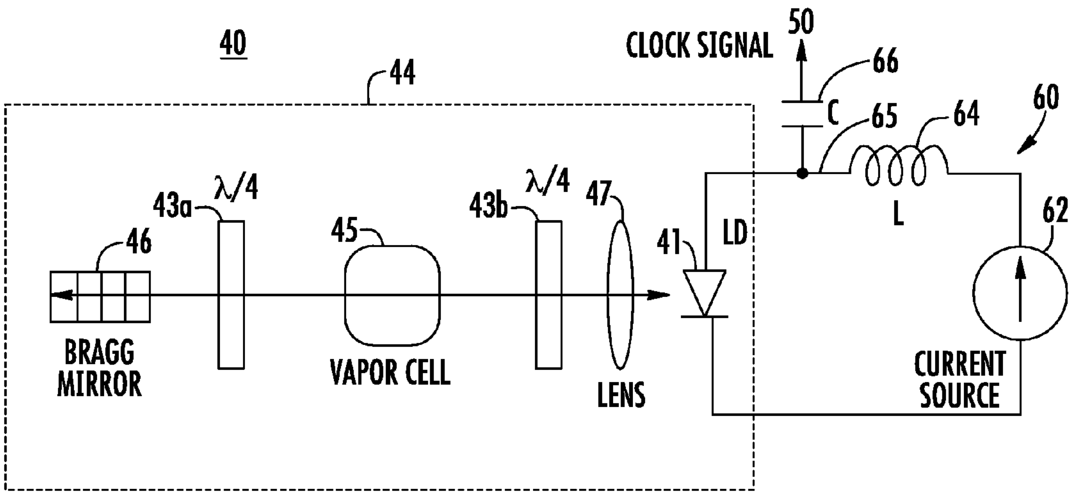
FIG. 4 is a schematic diagram of a system for operating the atomic clock.

FIG. 4 shows an embodiment of cavity configurations for atomic clock self-modulated laser system 40. A representative cavity configuration is described with only one gain medium, such as a laser diode in the laser cavity atomic clock. It is understood that two or more gain media are able to be incorporated inside the cavity, and different methods of using laser polarizations depend on the properties of gain media. Atomic clock self-modulated laser system 40 uses laser diode 41. For example, laser diode 41 can be an electronically pumped semiconductor, for example, quantum well hetero-junction edge-emitting laser diode (ELD) or vertical cavity surface emitting laser (VCSEL) diode. Laser diode 41 outputs light with linear polarization. In order to generate the alternation of photon spin, two quarter wave plates 43*a*, 43*b* are used inside laser cavity 44. Vapor cell 45 is positioned, where the laser beam has the maximum alternation of the light polarization, between quarter wave plates 43*a*, 43*b*. Bragg mirror 46 and lens 47 combine beams so that they emerge as a single beam of alternating circular polarization. In this embodiment, the cavity mode is used to achieve push-pull pumping. The effective round-trip time of push-pull pumping light is about the multiple of the hyperfine period. The laser cavity operates as a resonator to excite the self modulation.

Clock signal 50 can be directly extracted from laser diode 41 using coupling circuit 60. The modulated laser light of laser diode 41 causes substantial modulation of the electrical impedance of laser diode 41. The modulation of the electrical impedance can be due to the modulation of the density of gain centers (charge carriers) in the diode by the modulated stimulated emission of photons from these centers. Current source 62 is used for exciting laser diode 41. Inductor 64 is placed after current source 62 to determine a modulated voltage signal 65. Inductor 64 provides a larger voltage drop due to higher impedance at high clock frequency. The modulated voltage drop of laser diode 41 serves as modulated voltage signal 65. Modulated voltage signal 65 is coupled out of coupling circuit 60 with capacitor 66 to provide clock signal 50. Clock signal 50 can be enhanced by careful design of coupling circuit to the laser diode. By taking the AC characteristics of laser diode 41 into account and selecting the target signal frequency, coupling circuit 60 can be designed to provide maximum response of the voltage modulation.

Figures 5A, 5B, 5C, 5D:
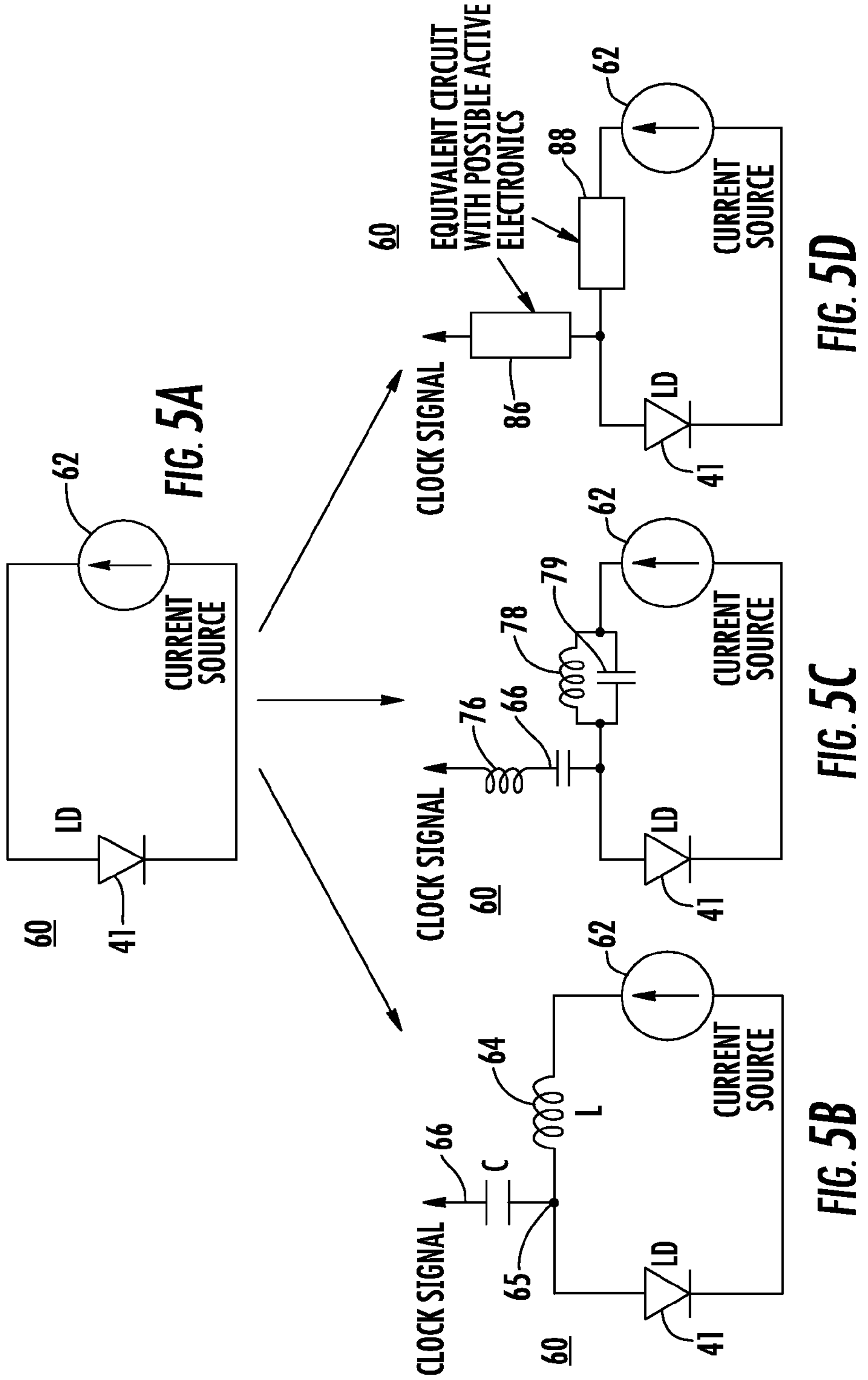
FIGS. 5A-5D are schematic diagrams for implementations of a coupling circuit used in the system of FIG. 4.

FIGS. 5A-5D illustrate embodiments for implementation of coupling circuit 60. FIG. 5A is a similar implementation of coupling circuit 60 as shown in FIG. 4. FIG. 5C includes indentation 76 after computer 66. Indicator 78 in combination with capacitor 79 is used in place of indicator 64. FIG. 5D represents an equivalent coupling circuit 60 including active electronics 86 and 88.

Figure 6:
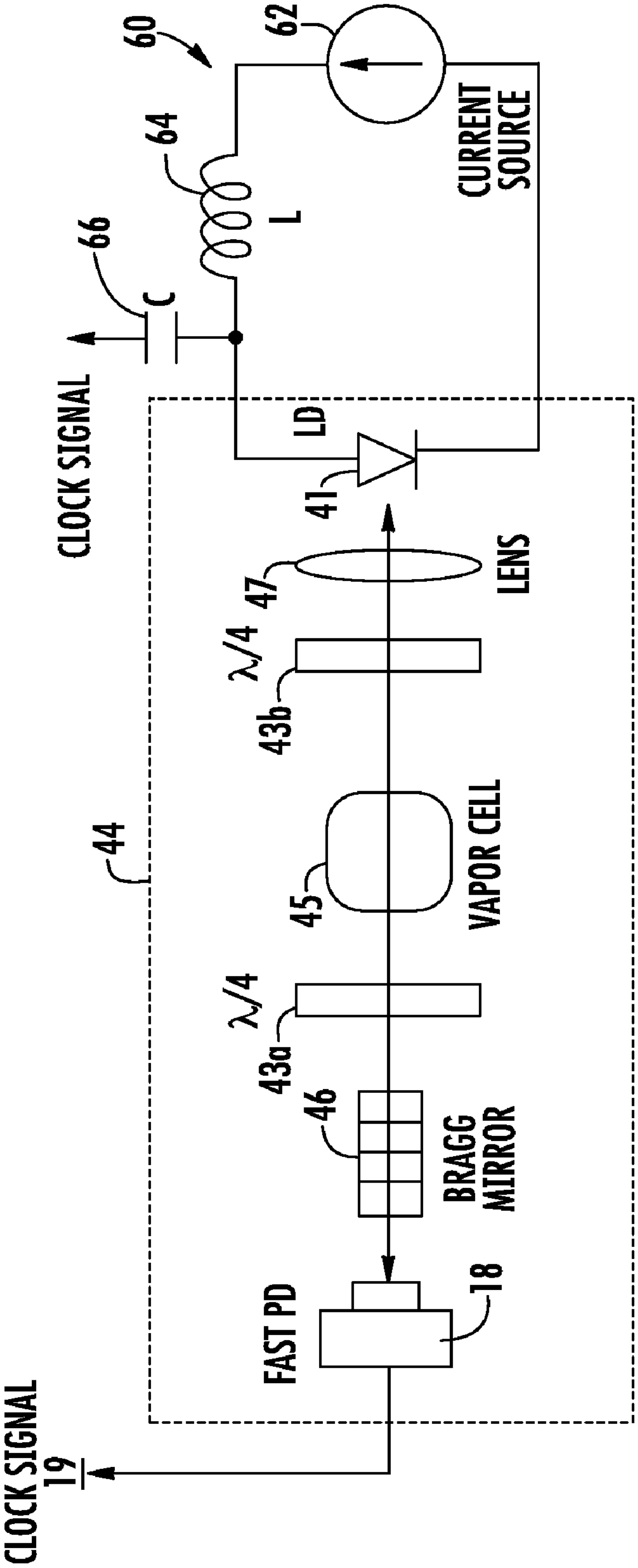
FIG. 6 is a schematic diagram of a system for testing the clock signal determined from the self-modulated laser directly or from a photodiode.
Figure 7B:
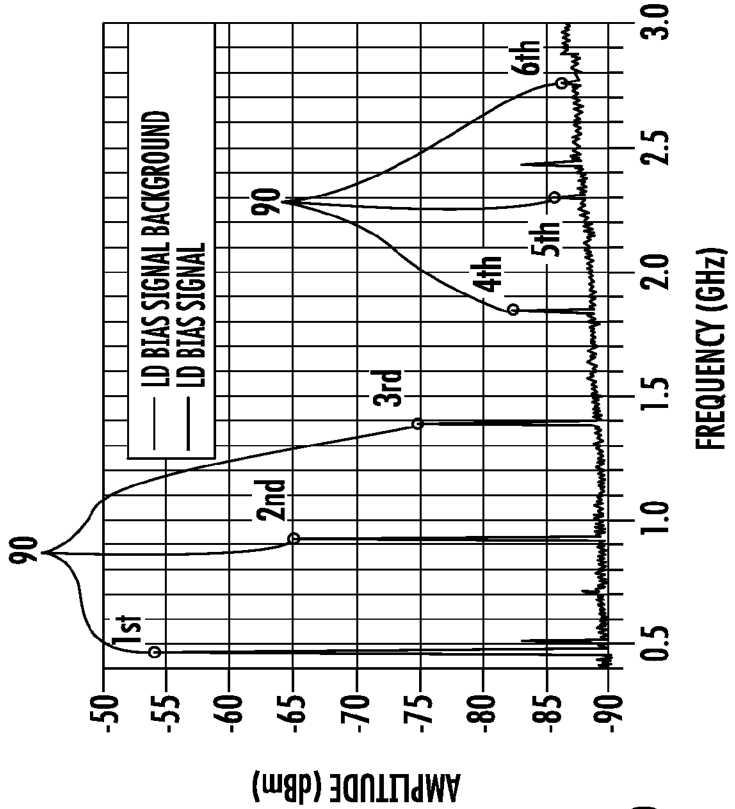
FIG. 7B is a graph of results from a spectrum analyzer for a clock signal generated by the laser diode of the system of FIG. 6.
Figure 7A:
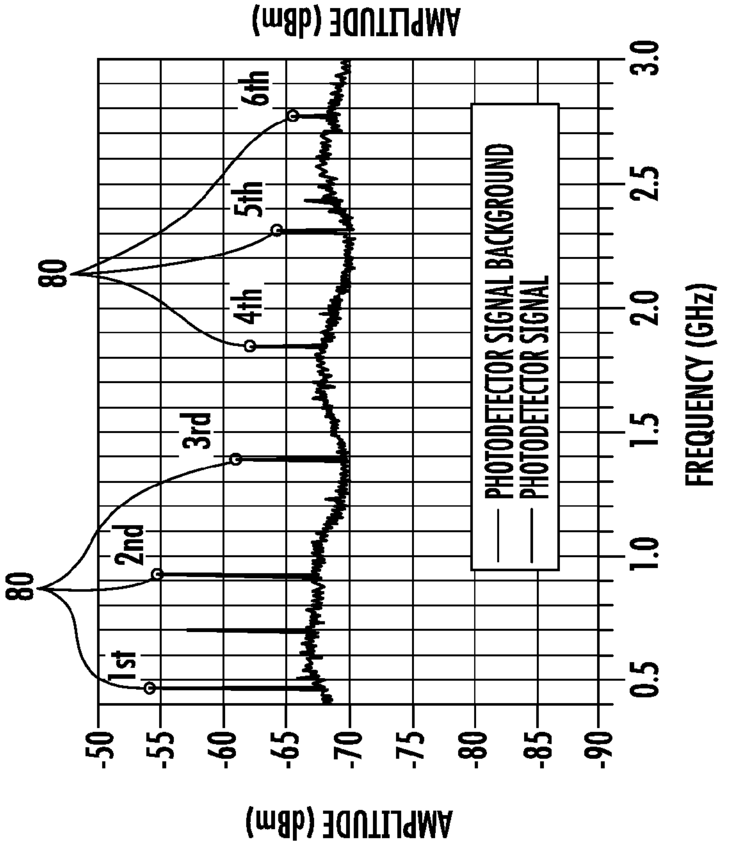
FIG. 7A is a graph of results from a spectrum analyzer for a clock signal generated by the photodiode of the system of FIG. 6.

FIG. 6 is a schematic diagram of a system used to test detection of a clock signal by either a prior art photodiode or directly from a laser diode in accordance with the teachings of the present invention. The clock signals are frequency harmonics of the potassium-39 ground-state hyperfine frequency (~462 MHz). Results from a microwave spectrum analyzer are shown in FIGS. 7A-713. Traces 80 shown in FIG. 6A show signals from the fast photodetector 18. Traces 90, as shown in FIG. 6B, show signals directly from laser diode 41. Due to the electric characteristics of the laser diode 41 and coupling circuit 60, the higher harmonics from the laser diode 41 drop off more rapidly with harmonic index than those of the fast photodiode 18. Although the first harmonics from both signals have about the same amplitude, it is shown the signal from photodiode 18 has 44 dB more gain than the signal from laser diode 41. Therefore, the signal from laser diode 41 is much stronger.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A method for operating an atomic clock comprising the steps of:

a) providing a self-modulating laser comprising gain media and a vapor cell within a laser cavity;

b) exciting hyperfine transitions of atoms within said vapor cell by pumping them with light from said laser modulated at a hyperfine frequency; and c) creating an electrical signal directly from said gain media using an input optical signal and a modulated voltage output from said gain media; and measuring an interval of time using the electrical signal.

2. The method of claim 1 wherein push-pull pumping inside the vapor cell is self-excited.

3. The method of claim 1 wherein an electric field of the pumping light inside the vapor cell is alternating its polarization at the hyperfine frequency.

4. The method of claim 1 wherein the modulation of photon spins is self-excited.

5. The method of claim 4 wherein the electronically pumped semiconductor is an emitting laser diode.

6. The method of claim 1 wherein the atomic hyperfine coherence is self-excited.

7. The method of claim 1 wherein the vapor cell is an alkali-metal vapor cell.

8. The method of claim 1 further comprising the step of: enhancing a particular harmonic of the clock signal.

9. The method of claim 1 wherein the photonic gain media is one or more electronically pumped semiconductors.

10. An atomic clock comprising:

photonic gain media and a vapor cell within a laser cavity, said vapor cell modulates said laser at a hyperfine frequency, and a coupling circuit coupled to said laser cavity, said coupling circuit determining an electrical signal for said atomic clock by using a modulated voltage determined directly from said photonic gain media; and wherein the atomic clock measures time using the electrical signal.

11. The atomic clock of claim 10 wherein push-pull pumping inside the vapor cell is self-excited.

12. The atomic clock of claim 10 wherein an electric field of the pumping light inside the vapor cell is alternating its polarization at the hyperfine frequency.

13. The atomic clock of claim 10 wherein the photonic gain media is one or more electronically pumped semiconductors.

14. The atomic clock of claim 13 wherein the electronically pumped semiconductor is an emitting laser diode.

15. The atomic clock of claim 10 further comprising a first quarter wave plate positioned between said photonic gain media and one side of said vapor cell and a second quarter wave plate positioned on an opposite side of said vapor cell, wherein said vapor cell positioned wherein the laser beam has a maximum alternation of light polarization.

16. The atomic clock of claim 10 wherein said photonic gain media and said vapor cell are compacted together with a Bragg mirror and lenses.

17. The atomic clock of claim 10 wherein said coupling circuit to the laser diode comprises a capacitor and inductor.

* * * * *